(12) United States Patent
Brede et al.

(10) Patent No.: US 6,930,622 B2
(45) Date of Patent: Aug. 16, 2005

(54) VOLTAGE LEVEL CONVERTER DEVICE

(75) Inventors: Rüdiger Brede, Höhenkirchen (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/834,382

(22) Filed: Apr. 29, 2004

(65) Prior Publication Data

US 2004/0246024 A1 Dec. 9, 2004

(30) Foreign Application Priority Data

Apr. 30, 2003 (DE) .......................................... 103 20 795

(51) Int. Cl.[7] .......................................... H03K 19/0175
(52) U.S. Cl. .......................................... 341/80; 326/83
(58) Field of Search .............................. 326/63–74, 80, 326/81, 83, 86

(56) References Cited

U.S. PATENT DOCUMENTS

| | | | | |
|---|---|---|---|---|
| 5,144,165 A | * | 9/1992 | Dhong et al. .................. | 326/80 |
| 5,912,577 A | | 6/1999 | Takagi | |
| 5,933,024 A | * | 8/1999 | Lim .............................. | 326/73 |
| 6,037,720 A | * | 3/2000 | Wong et al. .................. | 315/291 |
| 6,049,243 A | * | 4/2000 | Mihara et al. ............... | 327/333 |
| 6,268,744 B1 | * | 7/2001 | Drapkin et al. ................ | 326/81 |
| 6,288,591 B1 | * | 9/2001 | Riccio ......................... | 327/333 |
| 6,429,683 B1 | * | 8/2002 | Miller et al. .................. | 326/80 |
| 6,501,306 B1 | * | 12/2002 | Kim et al. ................... | 327/112 |
| 6,836,150 B2 | * | 12/2004 | Regev .......................... | 326/83 |

FOREIGN PATENT DOCUMENTS

| | | |
|---|---|---|
| DE | 33 40 567 C2 | 5/1984 |
| DE | 196 01 630 C1 | 6/1997 |
| EP | 0 439 149 A1 | 7/1991 |
| EP | 0 926 830 A2 | 6/1999 |
| EP | 1 184 983 A1 | 3/2002 |
| JP | 2-145018 | 6/1990 |
| JP | 4-117723 | 4/1992 |

* cited by examiner

*Primary Examiner*—Michael Tokar
*Assistant Examiner*—Linh V. Nguyen
(74) *Attorney, Agent, or Firm*—Morrison & Foerster LLP

(57) ABSTRACT

A voltage level converter device for the conversion of an input signal, which is at a first voltage level, into an output signal, which is at a second voltage level that differs from the first voltage level, where the voltage level converter device has at least one transistor, and in which an additional transistor, controlled by a control signal at a voltage level corresponding to that of the input signal, is provided in a current path that is to be accordingly switched on or off when the output signal switches over for switching that path on or off.

4 Claims, 4 Drawing Sheets

VOLTAGE LEVEL CONVERTER DEVICE

CLAIM FOR PRIORITY

This application claims priority to German Application No. 103 20 795.3 filed Apr. 30, 2003, which is incorporated herein, in its entirety, by reference.

TECHNICAL FIELD OF THE INVENTION

The invention relates to a voltage level converter device.

BACKGROUND OF THE INVENTION

In semi-conductor components, more particularly memory components such as DRAMs (Dynamic Random Access Memory and/or dynamic read/write memory) an internal voltage level used inside the component can differ from an external voltage level used outside the component.

In particular, an internally used voltage level can, for instance, be smaller than the externally used voltage level, for instance, an internally used voltage level can amount to 1.5 V or 1.8 V and the voltage level used externally for instance to 2.5 V or 2.9 V.

The reason for this can, for instance, be because the external voltage supply is subject to relatively strong fluctuations, and therefore needs to be converted to an internal voltage (which is subject only to relatively minor fluctuations and regulated to a particular constant value) by a voltage regulator, which allows the component to be operated in a fault-free way. The use of voltage regulators can however cause a voltage drop, which causes the voltage level used inside the component to be lower than the voltage level used out-side. An internal voltage level lower than that used externally can, for instance, have the advantage of reducing the power dissipation in the semi-conductor component.

Alternatively or additionally, an internal voltage level that is "turned up" or "boosted" in relation to the external voltage level can, for instance, also be used.

If necessary, several different internal voltage levels can also be used in the semi-conductor component (for example 1.5 V and 1.8 V, etc.).

If a different, more particularly a lower voltage level, than externally, is used inside the component (or several other, in particular, lower voltage levels), the signals generated inside the semi-conductor component must first—before being emitted to the outside—by a so-called voltage converter be converted to a corresponding—more particularly a higher—voltage.

Such a voltage converter can, for instance, contain an amplifier circuit, consisting of cross-coupled p- and/or n-channel field effect transistors.

With the aid of the amplifier circuit, internal, low-voltage signals generated in the component can be converted—although subject to certain delay times—into corresponding high-voltage signals.

The delay times occurring with conventional voltage converters can however be relatively large.

Furthermore, with conventional voltage converters it is only possible to attain a certain—limited—differential in levels between output signals (particularly at a higher level) and input signals (particularly at a lower level).

SUMMARY OF THE INVENTION

The present invention is directed to a novel voltage level converter device.

According to an aspect of the invention, a voltage level converter device is provided for converting an input signal at a first voltage level into an output signal at a second voltage level, different to the first, and where the voltage converter device has at least one transistor, characterized in that an additional transistor controlled by a control signal at a voltage level corresponding to that of the input signal is provided in a current path—that is to be accordingly switched on or off when the output signal switches over—for switching that path on or off.

Preferably the above input signal, or for instance a signal inverse to the input signal, is used as control signal for the additional transistor.

By switching off the (additional) transistor, and controlling the corresponding transistor with a signal at input rather than output voltage level (for instance by the input signal or a signal inverse thereto) the current path to be switched off will already have been placed in a corresponding high-impedance state at the start of the switching-over process.

Hereby the switching speed can be increased; i.e. the delay time of the switching over of the output signal can be reduced.

DETAILED DESCRIPTION OF THE INVENTION

Figure 1:
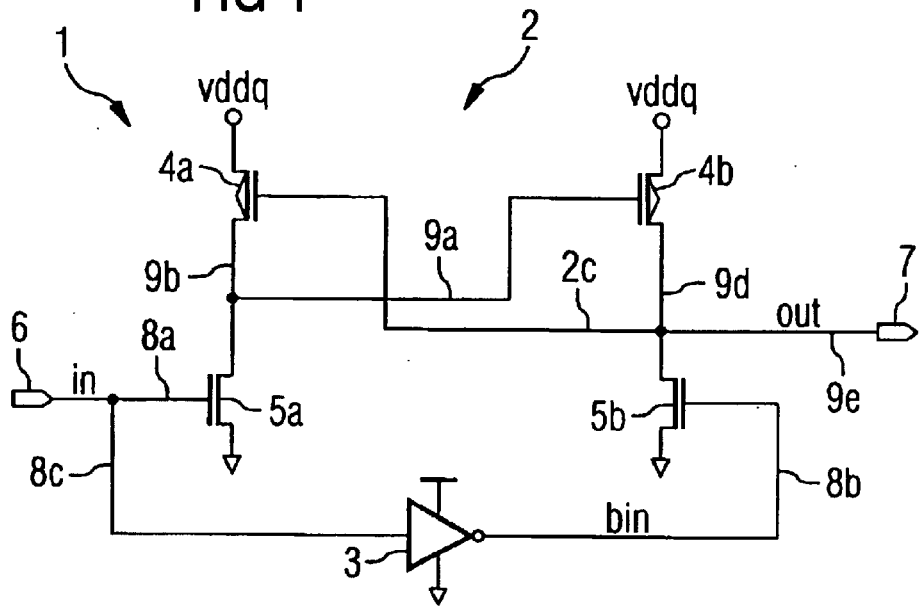
FIG. 1 is a schematic representation of the circuit configuration of a first example of a state-of-the-art voltage converter.

In FIG. 1, a schematic representation of a circuit configuration of a first example of a state-of-the-art voltage converter 1 is shown. The voltage converter 1 is built into a DRAM memory component, for instance one based on CMOS technology. The converter serves to convert the internal voltage level (vint) used inside the memory component to an external voltage level (vddq) used outside the memory component, whereby the internally used voltage level (vint) is lower than the externally used voltage level (vddq). The internal voltage level (vint) can for example amount to between 1.5 V and 2.0 V (here for instance 1.5 V or 1.8 V), and the external voltage level (vddq) for instance to between 2.5 V and 3.5 V (here for instance 2.5 V or 2.9 V).

As shown in FIG. 1, the voltage converter 1 has an amplifier circuit 2, having four cross-connected transistors 4a, 4b, 5a, 5b, i.e. a first and a second p-channel field effect transistor 4a, 4b (here: two p-channel MOSFETs 4a, 4b), as well as a first and a second n-channel field effect transistor 5a, 5b (here: two n-channel MOSFETs 5a, 5b).

The source of the first n-channel field effect transistor 5a is connected to ground (gnd). In similar fashion, the source of the second n-channel field effect transistor 5b is connected to ground (gnd).

Furthermore, the gate of the first n-channel field effect transistor 5a is connected to an input 6 of the amplifier circuit 2 via a line 8a.

The gate of the second n-channel field effect transistor 5b is connected via a line 8b to the output of an inverter 3, of which the input is similarly connected to the amplifier circuit input 6 via a line 8c (and a line 8a).

The drain of the first n-channel field effect transistor 5a is connected to the gate of the second p-channel field effect transistor 4b via a line 9a, and via a line 9b to the drain of the first p-channel field effect transistor 4a.

In similar fashion, the drain of the second n-channel field effect transistor 5b is connected via a line 9c to the gate of the first p-channel field effect transistor 4a, and via a line 9d to the drain of the second p-channel field effect transistor 4b, as well as via a line 9e to an output 7 of the amplifier circuit 2.

The source of the first and second p-channel field effect transistors 4a, 4b is connected to the supply voltage (external voltage), which—in comparison to the internally used voltage as illustrated above—is at a relatively high voltage level (vddq).

At the input 6 of the amplifier circuit 2 there is an internal signal (in) of the DRAM memory component present (which is therefore also present at the gate of the first n-channel field effect transistor Sa, and/or—in inverse and/or complementary form (signal bin)—present at the gate of the second n-channel field effect transistor 5b).

The internal signal (in and/or bin), always in the corresponding "high logic" state, as has been illustrated above, always shows the relatively lower internally used voltage level (vint) in comparison with the externally used voltage level.(vddq).

With the aid of the amplifier circuit 2, the internal signal (in) present at the input 6 of the amplifier circuit 2 is changed into a signal (out), corresponding to this signal (in), accessible at the output 7 of circuit 2 of the amplifier, which exhibits the above—relatively high—external voltage level (vddq).

When the internal signal (in) present at input 6 of the amplifier circuit 2 changes from a "high logic" to a "low logic" state (and the complementary internal signal (bin) from a "high logic" to a "low logic" state), the corresponding signal (out), detectable at output 7 of the amplifier circuit 2, changes its state from "low logic" to "high logic", although only after a certain delay time due to internal signal run times inside the amplifier circuit 2.

In similar fashion, the corresponding signal (out) accessible at output 7—also after a certain delay time—changes its state from "high logic" to "low logic" when the state of the internal signal (in) changes from "high logic" to "low logic" (and the state of the complementary internal signal (bin) changes from "low logic" to "high logic").

Figure 2:
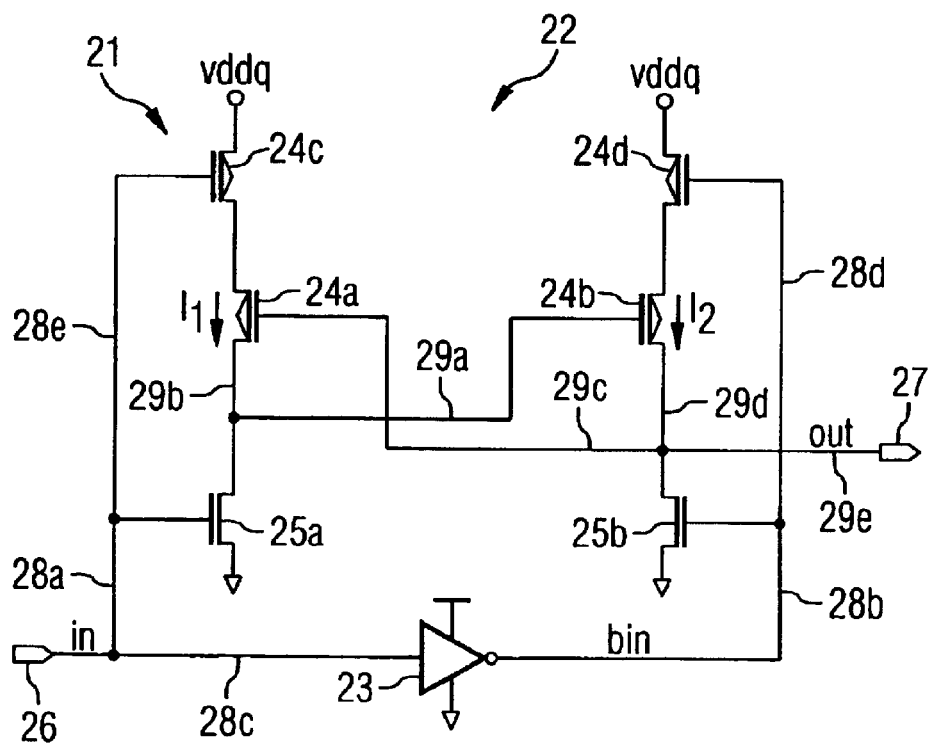
FIG. 2 is a schematic representation of a circuit configuration of a voltage converter according to a first embodiment example of the present invention.

FIG. 2 shows a schematic representation of a circuit configuration of a voltage converter 21 according to a first embodiment example of the present invention.

The voltage converter 21 has—corresponding to the voltage converter 1 shown in FIG. 1—been built into a semiconductor memory component—for instance especially into a DRAM-memory component based on CMOS technology. The converter serves to convert an internal voltage level (vint) used inside the memory component, into an external voltage level (vddq), used outside the memory component, whereby the internally used voltage level (vint) is lower than the externally used voltage level (vddq). For instance, the internal voltage level (vint) can amount to between 1.5 V and 2.0 V (here for instance 1.5 V or 1.8 V), and the external voltage level (vddq) for instance between 2.5 V and 3.5 V (here for instance 2.5 V or 2.9 V).

As shown in FIG. 2, the voltage converter 21 contains an amplifier circuit 22, which—correspondingly similar to the voltage converter 1 shown in FIG. 1—has four cross-connected transistors 24a, 24b, 25a, 25b (at the first and second p-channel field effect transistors 24a, 24b (here: two p-channel MOSFETs 24a, 24b), as well as a first and a second n-channel field effect transistor 25a, 25b (here: two n-channel MOSFETs 25a, 25b), as well as—and opposed to the voltage converter 1 shown in FIG. 1, and as more closely described below—two additional transistors 24c, 24d (at the third and fourth p-channel field effect transistors 24c, 24d (here: two p-channel MOSFETs 24c, 24d)).

Correspondingly similar to the first field effect transistor 5a as shown in FIG. 1, the source of the first n-channel field effect transistor 25a in the voltage converter 21 is connected to ground (gnd). In similar fashion (and correspondingly similar to the field effect transistor 5b as shown in FIG. 1) the source of the second n-channel field effect transistor 25b is also connected to ground (gnd).

Furthermore the gate of the first n-channel field effect transistor 25a is connected to an input 26 of the amplifier circuit 22 via a line 28a.

The gate of the second n-channel field effect transistor 25b is (correspondingly similar to the gate of the second field effect transistor 5b in the voltage converter 1 shown in FIG. 1) connected via a line 28b to the output of an inverter 23, of which the input is also connected to the amplifier circuit input 26 via a line 28c.

The drain of the first n-channel field effect transistor 25a is (correspondingly similar to the drain of the first field effect transistor 5a shown in FIG. 1) connected to the gate of the second p-channel field effect transistor 24b via a line 29a, and via a line 29b to the drain of the first p-channel field effect transistor 24a.

In similar fashion (and correspondingly similar to the drain of the second field effect transistor 5b shown in FIG. 1) the drain of the second n-channel field effect transistor 25b is connected via a line 29c to the gate of the first p-channel field effect transistor 24a, and via a line 29d to the drain of the second p-channel field effect transistor 24b, as well as—via a line 29e—to an output 27 of the amplifier circuit 22.

The source of the first and second p-channel field effect transistors 24a, 24b is—as opposed to the first and second field effect transistors 4a, 4b shown in FIG. 1—not directly connected to the supply voltage (external voltage), but under interconnection with the third and/or fourth p-channel field effect transistors 24c, 24d.

The source of the first p-channel field effect transistor 24a is further connected to the drain of the third p-channel field effect transistor 24c, and the source of the second p-channel field effect transistor 24b to the drain of the fourth p-channel field effect transistor 24d.

As further shown in FIG. 2, the source of the third p-channel field effect transistor 24c is connected to the supply voltage (at the relatively high voltage level vddq in comparison with the internal voltage), and the gate of the third p-channel field effect transistor 24c via a line 28e (and the above line 28a) to the input 26 of the amplifier circuit 22 and/or of the voltage converter 21.

In similar fashion the source of the fourth p-channel field effect transistor 24d is connected to the supply voltage (at the relatively high voltage level vddq in comparison with the internal voltage), and the gate of the fourth p-channel field effect transistor 24d via a line 28d (and the above line 28b) to the output of the inverter 23.

At the input 26 of the amplifier circuit 22 and/or of the voltage converter 21 there is an internal signal (in) ("input signal") from the DRAM memory component present (which signal is thereby also present at the gate of the first n-channel field effect transistor 25, as well as at the gate of the third p-channel field effect transistor 24c, and/or—in inverse and/or complementary form (signal bin)—at the gate of the second n-channel field effect transistor 25b, and at the gate of the fourth p-channel field effect transistor 24d).

The internal signals (in and/or bin) are always—as already described above—(at the corresponding "high logic" state) at the relatively low internally used voltage level (vint) in comparison with the externally used voltage level (vddq).

With the aid of the amplifier circuit 22, the internal signal (in) present at the input 26 of the amplifier circuit 22 is converted into a signal (out)—corresponding to the signal (in) and accessible at output 27—of the amplifier circuit 22—at the above—relatively high—external voltage level (vddq).

When the internal signal (in) present at the input 26 of the amplifier circuit 22 changes from a "low logic" to a "high logic" state (and the complementary internal signal (bin) from a "high logic" to a "low logic" state), and thereby the signal emitted at the drain of the first n-channel field effect transistor 25a from "high logic" to "low logic" (and complementary to that, the signal emitted at the drain of the second n-channel field effect transistor 25b changes from "low logic" to "high logic"), the corresponding signal (out) accessible at the output 27 of the amplifier circuit 22 changes its state from "low logic" to "high logic".

Thereby the transistor 24b is brought into a conductive state, and the transistor 24a into a blocked state (whereby the current path $I_1$, here: the drain-source current path of the transistor 24a, is switched off).

In similar fashion, the signal emitted at the drain of the first n-channel field effect transistor 25a changes its state from "low logic" to "high logic" (and in complementary fashion the signal emitted at the drain of the second n-channel field effect transistor 25b changes its state from "high logic" to "low logic"), when the state of the internal signal (in) changes from "high logic" to "low logic" (and when the state of the complementary internal signal (bin) changes from "low logic" to "high logic") and thereby the corresponding signal (out) accessible at output 27 also changes its state from "high logic" to "low logic".

Thereby the transistor 24a is brought into a conductive state, and the transistor 24b into a blocked state (whereby the current path 12, here: the drain source current path of the transistor 24b, is switched off).

As is apparent from FIG. 2, the above—additional—transistors 24c, 24d (here: the third and fourth p-channel field effect transistors 24c, 24d) have been connected in the current path 11 and/or 12 (here: the drain source current path of the first p-channel field effect transistor 24a, and/or the drain source current path of the second p-channel field effect transistor 24b) which is to be switched off in every case.

If the internal signal (in) present at the input 26 of the amplifier circuit 22—as described above—changes from a "low logic" to a "high logic" state (and the complementary internal signal (bin) from a state of "high logic" to a state of "low logic"), the—additional—transistor 24c is brought into a blocked state (i.e. switched off), and the—additional—transistor 24d into a conductive state (i.e. switched on).

Conversely, if the internal signal (in) present at the input 26 of the amplifier circuit 22 changes from a "high logic" to a "low logic" state, and the complementary internal signal (bin) from a state of "low logic" to a state of "high logic", the—additional—transistor 24c is brought into a conductive state (i.e. switched on), and the—additional—transistor 24d blocked (i.e. switched off).

By switching off each of the (additional) transistors 24c and/or 24d in each current path $I_1$ and/or $I_2$ to be switched off, and by controlling the corresponding transistors 24c and/or 24d described above with a signal at input instead of at output voltage level (i.e. with the above internal signal (in) and/or (bin)), each current path $I_1$ and/or $I_2$ to be switched off is already brought into a high impedance state at the start of the switching process.

Hereby the switching speed can be increased, i.e. the delay time at the switching over of the output signal (out) can be reduced.

Furthermore the cross-currents flowing during switching over can be reduced, whereby larger voltage level differentials between output signal (out) and input signal (in) can be achieved than with corresponding conventional circuits.

Figure 3:
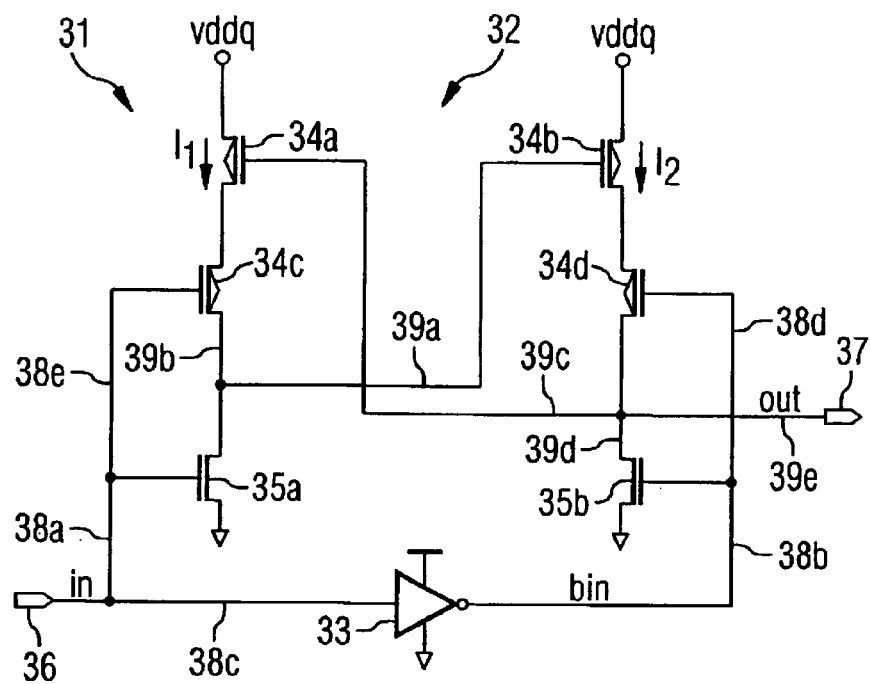
FIG. 3 is a schematic representation of the circuit configuration of a voltage converter according to a second embodiment example of the present invention.

FIG. 3 shows a schematic representation of a circuit configuration of a voltage converter 31 according to a further, second embodiment example of the present invention. The voltage converter 31 is built into a semi-conductor memory component—for instance one based on CMOS technology—in particular a DRAM memory component, corresponding to the voltage converters 1, 21 shown in FIGS. 1 and 2. It serves to convert an internal voltage level (vint) used inside the memory component into an external voltage level (vddq) used outside the memory component, whereby the internally used voltage level (vint) is lower than the externally used voltage level (vddq). For example, the internal voltage level (vint) can amount to between 1.5 V and 2.0 V (here for instance 1.5 V or 1.8 V), and the external voltage level (vddq) for instance to between 2.5 V and 3.5 V (here for instance 2.5 V or 2.9 V).

As shown in FIG. 3, the voltage converter 31 has an amplifier circuit 32, which—correspondingly similar to the voltage converter shown in FIG. 2—contains four cross-connected transistors 34a, 34b, 35a, 35b (a first and a second p-channel field effect transistor 34a, 34b (here: two p-channel MOSFETs 34a, 34b), as well as the first and second n-channel field effect transistors 35a, 35b (here: two n-channel MOSFETs 35a, 5b), as well as—correspondingly similar to the voltage converter 21 shown in FIG. 2, and more closely described below—two additional transistors 34c, 34d (a third and a fourth p-channel field effect transistor 34c, 34d (here: two p-channel MOSFETs 34c, 34d)).

Correspondingly similar to the field effect transistors 5a, 25a shown in FIGS. 1 and 2, the source of the first n-channel field effect transistor 35a on the voltage converter 31 is connected to ground (gnd). In similar fashion (and correspondingly similar to the field effect transistors 5b, 25b shown in FIGS. 1 and 2) the source of the second n-channel field effect transistor 35b is also connected to ground (gnd).

Furthermore the gate of the first n-channel field effect transistor 35a is connected to an input 36 of the amplifier circuit 32 via a line 38a.

The gate of the second n-channel field effect transistor 35b is (correspondingly similar to the gate of the field effect transistors 5b, 25b of the voltage converters 1, 2 shown in FIGS. 1 and 2) connected via a line 38b to the output of an inverter 33, of which the input is also connected to the amplifier circuit input 36 via a line 38c.

The drain of the first n-channel field effect transistor 35a is connected (correspondingly similar to the drain of the field effect transistors 5a, 25a shown in FIGS. 1 and 2) to the gate of the second p-channel field effect transistor 34b via a line 39a.

In similar fashion (correspondingly similar to the drain of the field effect transistors 5b, 25b shown in FIGS. 1 and 2) the drain of the second n-channel field effect transistor 35b is connected via a line 39c to the gate of the first p-channel field effect transistor 34a, as well as—via a line 39e—to an output 37 of the amplifier circuit 32.

Furthermore, the drain of the first and/or second n-channel field effect transistors 35a, 35b—as opposed to the first and second n-channel field effect transistors 35a, 35b shown in FIGS. 1 and 2—is not directly connected to the drain of the first and/or second p-channel field effect transistor 34a, 34b, but always interconnected to the third and/or fourth p-channel field effect transistors 34c, 34d.

Thereby, the drain of the first n-channel field effect transistor 35a is connected to the drain of the third p-channel field effect transistor 34c, and the drain of the second n-channel field effect transistor 35b to the drain of the fourth p-channel field effect transistor 34d.

Furthermore, the source of the third p-channel field effect transistor 34c is connected to the drain of the first p-channel field effect transistor 34a, and the source of the fourth p-channel field effect transistor 34d to the drain of the second p-channel field effect transistor 34b.

The source of the first and second p-channel field effect transistors 34a, 34b is in each case directly connected to the supply voltage (external voltage), which, as already described above, is at a relatively high voltage level (vddq)—compared to the internally used voltage.

As further shown in FIG. 3, the gate of the third p-channel field effect transistor 34c is connected via a line 38e (and the above-mentioned line 38a) to the input 36 of the amplifier circuit 32 and/or of the voltage converter 31.

In similar fashion the gate of the fourth p-channel, field effect transistor 34d is connected via a line 38d (and the above-mentioned line 38b) to the output of the inverter 33 (of which the input—as already described, is connected to the amplifier circuit input 36—via a line 38c).

At the input 36 of the amplifier circuit 32 and/or of the voltage converter 31 there is an internal signal (in) ("input signal") of the DRAM memory component present (which signal is also present at the gate of the first n-channel field effect transistor 35a, as well as at the gate of the third p-channel field effect transistor 34c, and/or—in inverse and/or complementary form (signal bin)—at the gate of the second n-channel field effect transistor 35b, and at the gate of the fourth p-channel field effect transistor 34d).

The internal signals (in and/or bin) are—as already described above—(in each case in the corresponding "high logic" state)—at the relatively low, internally used voltage level (vint) in comparison with the externally used voltage level (vddq).

With the aid of the amplifier circuit 32 the internal signal (in) present at the input 36 of the amplifier circuit 32—is converted into a signal (out)—corresponding to this (in) signal—available at the output 37 of the amplifier circuit 32 and at the above—relatively high—external voltage level (vddq).

When the internal signal (in) present at input 36 of the amplifier circuit 32, changes from a "low logic" to a "high logic" state (and the complementary internal signal (bin) from a "high logic" to a "low logic" state), and thereby the signal emitted at the drain of the first n-channel field effect transistor 35a from "high logic" to "low logic" (and in complementary fashion the signal emitted at the drain of the second n-channel field effect transistor 35b from "low logic" to "high logic"), the signal (out) available at output 37 of the amplifier circuit 32 correspondingly changes its state from "low logic" to "high logic".

Hereby, the transistor 34b is brought into a conductive, and the transistor 34a into a blocked state (whereby the current path II, here: the drain-source current path of the transistor 34a, is switched off).

In similar fashion, the signal emitted at the drain of the first n-channel field effect transistor 35a changes its state from "low logic" to "high logic" at a change of the state of the internal signal (in) from "high logic" to "low logic" (and a change of the state of the complementary internal signal (bin) from "low logic" to "high logic")(and in complementary fashion the signal emitted at the drain of the second n-channel field effect transistor 35b changes its state from "high logic" to "low logic"), and thereby the signal (out) correspondingly accessible at output 37 changes its state from "high logic" to "low logic".

Hereby, the transistor 34a is brought into a conductive, and the transistor 34b into a blocked state (whereby the current path $I_2$, here: the drain-source current path of the transistor 34b is switched off).

As is apparent from FIG. 3, the above additional transistors 34c, 34d (here: the third and fourth p-channel field effect transistors 34c, 34d) have been connected into the current path $I_1$ and/or 12 to be switched off in each case (here: the current path containing the drain source current path of the first p-channel field effect transistor 34a, and/or the current path containing the drain source current path of the second p-channel field effect transistor 34b).

If, as described above, the internal signal (in) present at the input 36 of the amplifier circuit 32 changes from a "low logic" to a "high logic" state (and the complementary internal signal (bin) from a "high logic" to a "low logic" state), the additional transistor 34c is brought into a blocked state (and the additional transistor 34d into a conductive state).

When conversely the internal signal (in) present at the input 36 of the amplifier circuit 32 changes from a "high logic" to a "low logic" state, and the complementary internal signal (bin) from a "low logic" to a "high logic" state, the additional transistor 34c is brought into a conductive state, and the additional transistor 34d blocked.

By switching off the (additional) transistor 34c and/or 34d in the current path $I_1$ and/or $I_2$ to be switched off in each case and by controlling the corresponding transistor 34c and/or 34d described above by a signal at input rather than at output voltage level (i.e. with the above internal signal (in) and/or (bin)), the current path $I_1$ and/or $I_2$ to be switched off in each case will have already been placed in an corresponding high-impedance state at the start of the switching process.

Herewith, the switching speed can be increased, i.e. the delay time at the switching over of the output signal (out) can be reduced.

Furthermore, the cross-currents present at the switching-over can be reduced, whereby larger voltage level differentials between output signals (out), and input signals (in) can be achieved than with corresponding conventional circuits.

Figure 4:
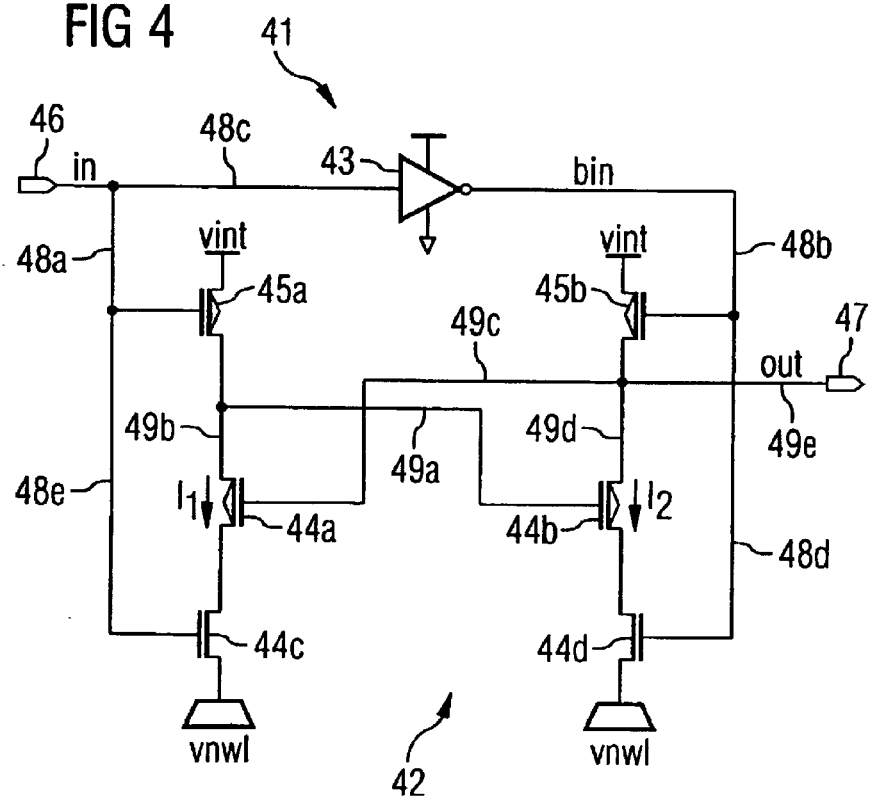
FIG. 4 is a schematic representation of a circuit configuration of a voltage converter according to a third embodiment example of the present invention.

FIG. 4 shows a schematic representation of a circuit configuration of a voltage converter 41 according to a third embodiment example of the present invention. The voltage converter 41, like the voltage converters 1, 21, 31 shown in FIGS. 1, 2 and 3, has been built into a semi-conductor memory component, for instance one based on CMOS technology, in particular a DRAM-memory component. It serves, as more closely described below, to convert the internal voltage level used in the memory component into the corresponding external voltage level used outside the memory component.

As shown in FIG. 4, the voltage converter 41 has an amplifier circuit 42, which, correspondingly similar to the voltage converters 1, 21, 31 shown in FIGS. 1, 2 and 3, contains four cross-connected transistors 44a, 44b, 45a, 45b (in fact a first and a second n-channel field effect transistor 44a, 44b (here: two n-channel MOSFETs 44a, 44b), as well as a first and a second p-channel field effect transistor 45a, 45b (here: two p-channel MOSFETs 45a, 45b), as well as, as opposed to corresponding conventional circuits, and as more closely described below, two additional transistors 44c, 44d (in fact a third and a fourth n-channel field effect transistor 44c, 44d (here: two n-channel MOSFETs 44c, 44d)).

The source of the first p-channel field effect transistor 45a is connected to a first, internal voltage, which carries a first internal (here: a positive) voltage level (vint), for instance lying between +1.5 V and +2.0 V (here for instance +1.5 V or +1.8 V).

In similar fashion to the first p-channel field effect transistor 45a, the source of the second p-channel field effect transistor 45b is also connected to the first, internal voltage (with a positive voltage level (vint) for instance between +1.5 V and +1.8 V).

The gate of the first p-channel field effect transistor 45a is further connected to an input 46 of the amplifier circuit 42 via a line 48a.

The gate of the second p-channel field effect transistor 45b is connected via a line 48b to the output of an inverter 43, whose input is similarly connected to the amplifier circuit input 46 via a line 48c.

The drain of the first p-channel field effect transistor 45a is connected to the gate of the second n-channel field effect transistor 44b via a line 49a, and via a line 49b to the drain of the first n-channel field effect transistor 44a.

In similar fashion, the drain of the second p-channel field effect transistor 45b is connected via a line 49c to the gate of the first n-channel field effect transistor 44a, and via a line 49d to the drain of the second n-channel field effect transistor 44b, as well as, via a line 49e, to an output 47 of the amplifier circuit 42.

The source of the first and second n-channel field effect transistors 44a, 44b is—in contrast to corresponding conventional circuits, not directly connected to the second internal voltage (with a—negative—voltage level (vnwl) for instance between −0.2 V and 0.6 V, in particular −0.4 V), but in each case with the third and/or fourth n-channel field effect transistor 44c, 44d interconnected.

Hereby the source of the first n-channel field effect transistor 44a is connected to the drain of the third n-channel field effect transistor 44c, and the source of the second n-channel field effect transistor 44b to the drain of the fourth n-channel field effect transistor 44d.

As further shown in FIG. 4, the source of the third n-channel field effect transistor 44c is connected to the above second internal voltage (at the above voltage level vnwl), and the gate of the third n-channel field effect transistor 44c via a line 48e (and the above line 48a) to the input 46 of the amplifier circuit 42 and/or of the voltage converter 41.

In similar fashion, the source of the fourth n-channel field effect transistor 44d is connected to the above second internal voltage (at the above voltage level vnwl), and the gate of the fourth n-channel field effect transistor 44d via a line 48d (and the above a line 48b) to the output of the inverter 43.

At the input 46 of the amplifier circuit 42 and/or of the voltage converter 41 there is an internal signal (in) ("input signal") of the DRAM-memory component present (which is thereby also present at the gate of the first p-channel field effect transistor 45a, as well as at the gate of the third n-channel field effect transistor 44c, and/or, in inverse and/or complementary form (signal bin), at the gate of the second p-channel field effect transistor 45b, and at the gate of the fourth n-channel field effect transistor 44d).

The internal signals (in and/or bin) are, in the corresponding "high logic" state, at the above (first) internal voltage level (vint); (here for instance +1.5 V or +1.8 V), and, in the corresponding "low logic" state, at a correspondingly lower voltage level (for instance 0 V (earth voltage)).

With the aid of the amplifier circuit 42, the internal signal (in) present at the input 46 of the amplifier circuit 42 is converted into a signal (out)—corresponding to this signal (in)—accessible at the output 47 of the amplifier circuit 42—which (out) signal—in the corresponding "high logic" state—is at the above (first, positive) internal voltage level (vint)(here for instance +1.5 V or +1.8 V), and—in the corresponding "low logic" state—at the above (second, negative) internal voltage level (vnwl) of between for instance between −0.2 V and −0.6 V, in particular −0.4 V.

When the internal signal (in) present at the input 46 of the amplifier circuit 42 changes from a "low logic" to a "high logic" state (and the complementary internal signal (bin) from a "high logic" state to a "low logic" state), and thereby the signal emitted at the drain of the first p-channel field effect transistors 45a from "high logic" to "low logic" (and in complementary fashion the signal emitted at the drain of the second p-channel field effect transistor 45b changes from "low logic" to "high logic"), the corresponding (out) signal accessible at the output 47 of the amplifier circuit 42 changes its state from "low logic" to "high logic".

Thereby, the transistor 44b is brought into a blocked, and the transistor 44a into a conductive state (whereby the current path $I_2$, here: the drain-source current path of the transistor 44b is switched off).

In similar fashion, the signal emitted at the drain of the first p-channel field effect transistor 45a changes from "low logic" to "high logic" at a change of the state of the internal signals (in) from "high logic" to "low logic" (and a change of the state of the complementary internal signal (bin) from "low logic" to "high logic") and complementary to that, the signal emitted at the drain of the second p-channel field effect transistor 45b changes its state from "high logic" to "low logic"), and the (out) signal correspondingly accessible at output 47 also changes its state from "high logic" to "low logic".

Hereby, the transistor 44a is brought into a blocked, and the transistor 44b into a conductive state (whereby the current path $I_1$, here: the drain-source current path of the transistor 44a, is switched off).

As is apparent from FIG. 4, the above additional transistors 44c, 44d (here: the third and fourth n-channel field effect transistors 44c, 44d) are connected into each current path $I_1$ and/or $I_2$ (here: the current path containing the drain source current path of the first n-channel field effect transistor 44a, and/or the current path containing the drain source current path of the second n-channel field effect transistor 44b) that needs to be switched off.

When, as described above, the internal signal (in) present at the input 46 of the amplifier circuit 42, changes from a "low logic" to a "high logic" state (and the complementary internal signal (bin) from a "high logic" state to a "low logic" state), the additional transistor 44c is brought into in a conductive state (and the additional transistor 44d into a blocked state).

If conversely the internal signal (in) present at the input 46 of the amplifier circuit 42 changes from a "high logic" to a "low logic" state, and the complementary internal signal (bin) from a "low logic" state to a "high logic" state, the additional transistor 44c is brought into a blocked state and the additional transistor 44d made conductive.

By switching off each (additional) transistor 44c and/or 44d in the current path $I_1$ and/or $I_2$, needing to be switched off, and the above controlling of the corresponding transistor 44c and/or 44d by a signal at input instead of at output voltage level (i.e. with the above internal signal (in) and/or (bin)) the current path $I_1$ and/or $I_2$ to be switched off in each case has already been brought into a high-impedance state at the start of the switching process.

Hereby, the switching speed can be increased, i.e. the delay time of the switching over of the output signal (out) can be reduced.

Furthermore, the cross-currents flowing during switching over can be reduced, whereby larger voltage level differentials between output signal (out) and input signal (in) can be achieved than with corresponding conventional circuits.

In further alternative, embodiment examples not expressly shown here, the additional transistors corresponding to transistors 44c, 44d can also be connected at another corresponding location in the pat $I_1$ and/or $I_2$ to be switched off in each case than that in the embodiment example shown in FIG. 4.

For example the transistors corresponding to the transistors 44c (and correspondingly controlled) can also be connected between the source of the first n-channel field effect transistor 44a, and the above second, internal voltage (at the above voltage level vnwl), also for instance between the drain of the first n-channel field effect transistor 44a, and the drain of the first p-channel field effect transistor 45a (so that the drain of the corresponding transistor is connected to the drain of the first p-channel field effect transistor 45a, and with line 49a).

Furthermore, the transistor corresponding with transistor 44d (and correspondingly controlled) can also be connected between the drain of the second n-channel field effect transistor 44b, and the drain of the second p-channel field effect transistor 45b (so that the drain of the corresponding transistor is connected to the drain of the second p-channel field effect transistor 45b, and the line 49d), instead of being connected between the source of the second n-channel field effect transistor 44b, and the above second, internal voltage (at the above voltage level vnwl) etc.

Figure 5:
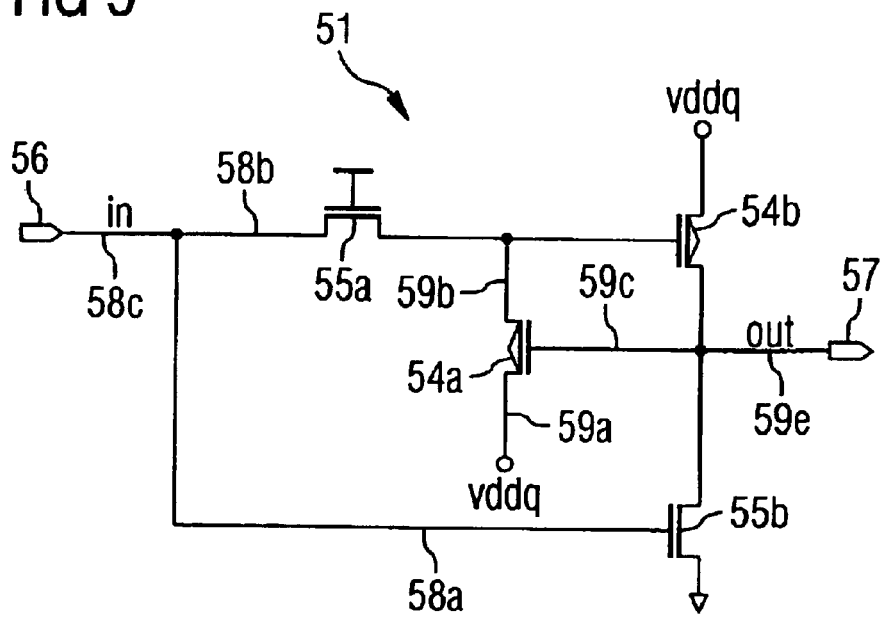
FIG. 5 shows a schematic representation of a circuit configuration of a further alternative. example of a state-of-the-art voltage converter.

FIG. 5 shows a schematic representation of a circuit configuration of a further, alternative example of a state-of-the-art voltage converter and/or level shifter 51. The voltage converter and/or level shifter 51 is built into a DRAM-memory component, for instance one based on CMOS technology. It serves to convert an internal voltage level (vint), used inside the memory component, into an external voltage level (vddq) used outside the memory component, whereby the internally used voltage level (vint) is smaller than the externally used voltage level (vddq). For example, the internal voltage level (vint) can lie between 1.5 V and 2.0 V (here for instance 1.5 V or 1.8 V), and the external voltage level (vddq) for instance between 2.5 V and 3.5 V (here for instance 2.5 V or 2.9 V).

As shown in FIG. 5, the voltage converter 51 has four transistors 54a, 54b, 55a, 55b to, namely a first and a second p-channel field effect transistor 54a, 54b (here: two p-channel MOSFETs 54a, 54b), as well as a first and a second n-channel field effect transistor 55a, 55b (here: two n-channel MOSFETs 55a, 55b).

The source of the second p-channel field effect transistor 54b is connected to the (external) supply voltage. This voltage is, as already described above, at a relatively high voltage level (vddq), in comparison to the internally used voltage.

The drain of the second p-channel field effect transistor 54b is connected to the drain of the second n-channel field effect transistor 55b, as well as to the gate of the first p-channel field effect transistor 54a, and is connected to output 57 of the voltage converter 51 via a line 59e.

As further shown in FIG. 5, the source of the second n-channel field effect transistor 55b is connected to ground (gnd), and the gate of the second n-channel field effect transistor 55b, via a line 58a and a line 58c, to an input 56 of the voltage converter 51.

The source of the first p-channel field effect transistor 54a is connected via a line 59a to the supply voltage (at the relatively high voltage level (vddq)).

Furthermore, the drain of the first p-channel field effect transistor 54a is connected via a line 59b to the gate of the second p-channel field effect transistor 54b, and to the drain of the first n-channel field effect transistor 55a, and the gate of the first p-channel field effect transistor 54a via a line 59c to the voltage converter-output 57 (and in each case to the drain of the second n- and of the second p-channel field effect transistor 55b, 54b).

As further shown in FIG. 5, the source of the first n-channel field effect transistor 55a is connected to the input 56 of the voltage converter 51 via a line 58b, and with a line 58c connected to it, and the gate of the first n-channel field effect transistor 55a (fixed) to the internal voltage (at the above, relatively low, voltage level (vint)).

At input 56 of the voltage converter 51 there is an internal signal (in) of the DRAM-memory component present (and thereby also at the gate of the second n-channel field effect transistor 55b, and at the source of the first n-channel field effect transistor 55a).

The internal signal (in) is at the relatively low internally used voltage level (vint), as already described above, (always in the corresponding "high logic" state) in comparison with the externally used voltage level (vddq).

With the aid of the voltage converter 51, the internal signal (in) present at its input 56 can be converted into a signal (out), at the above relatively high external voltage level (vddq)), correspondingly inverse to this (in) signal and accessible at output 57 of the voltage converter 51.

When the internal signal (in) present at the input 56 of the voltage converter 51 changes from "low logic" to "high logic", the corresponding (out) signal accessible at the output 57 of the voltage converter 51 correspondingly changes its state, as more closely described below and after a certain delay time, from "high logic" to "low logic".

Due to the change in the internal signal (in) present at input 56 of the voltage converter 51 from "low logic" to "high logic" the (formerly blocked) transistor 55b is brought into a conductive state, and the transistor 54b is blocked, though not (yet) completely. As a result of this, the (formerly blocked) transistor becomes 54a conductive, whereby the signal present at the gate of the transistor 54b changes its state from "low logic" to "high logic". Hereby the transistor 54b (formerly not yet completely blocked) is completely blocked; at the output of the voltage converter 57, as already described above, a "low logic" output signal (out) is emitted (during the entire switching-over process the transistor 55a remains in a conductive state).

In correspondingly inverse fashion, the signal (out) correspondingly accessible at output 57, changes its state from "low logic" to "high logic," also after a certain delay period, at a change of the state of the internal signal (in) from "high logic" to "low logic".

Due to the change of internal signal (in) present at input 56 of the voltage converter 51 from "high logic" to "low logic" transistor 55b is blocked, and transistor 54b made, although not (yet) completely, conductive. Thereby, transistor 54a is blocked, whereby the signal present at the gate of transistor 54b changes its state from "high logic" to "low logic". Hereby the, formerly not completely conductive, transistor 54b becomes fully conductive; at the output of the voltage converter 57 a "high logic" output signal (out), as described above, is emitted (whereby transistor 55a, again, remains in a conductive state during the entire switching-over process).

Figure 6:
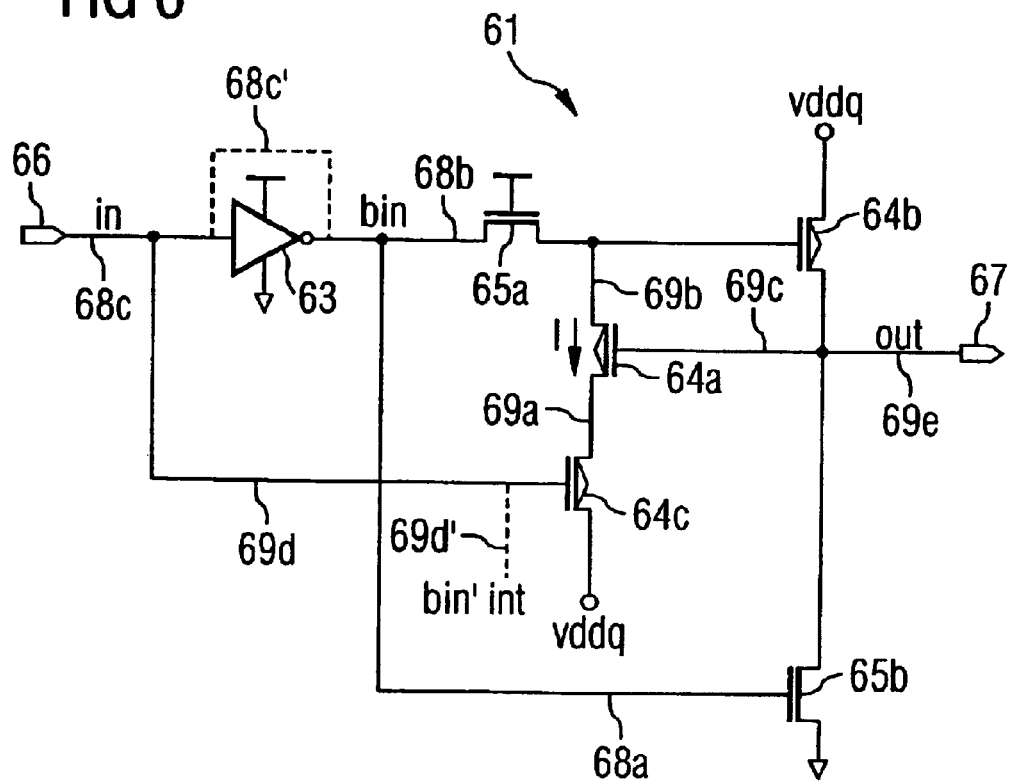
FIG. 6 is a schematic representation of a circuit configuration of a voltage converter according to a further embodiment example of the present invention.

FIG. 6 shows a schematic representation of a circuit configuration of a further embodiment example of a voltage converter and/or level shifter 61 according to the present invention.

The voltage converter and/or level shifter 61 is, as with the voltage converter 51 shown in FIG. 5, built into a DRAM-memory component, for instance one based on CMOS technology. It serves to convert an internal voltage level (vint), used inside the memory component into an external voltage level (vddq) used outside the memory component, whereby the internally used voltage level (vint) is lower than the externally used voltage level (vddq). For example, the internal voltage level (vint) can lie between 1.5 V and 2.0 V (here for instance 1.5 V or 1.8 V), and the external voltage level (vddq) for instance between 2.5 V and 3.5 V (here for instance 2.5 V or 2.9 V).

As is apparent from FIG. 5 and FIG. 6, the voltage converter 61 shown in FIG. 6 corresponds in its construction to the voltage converter 51 shown in FIG. 5, except that, as is more closely described below, an inverter 63 has been additionally provided in the voltage converter 61 shown in FIG. 6, as well as an additional transistor 64c (in fact a (third) p-channel field effect transistor 64c (here: a p-channel MOSFET 64c)).

Correspondingly, similar to the voltage converter 51 shown in FIG. 5, the voltage converter 61 has, in addition to the above additional transistor 64c—four transistors 64a, 64b, 65a, 65b to, in fact first and second p-channel field effect transistors 64a, 64b (here: two p-channel MOSFETs 64a, 64b), as well as first and second n-channel field effect transistors 65a, 65b (here: two n-channel MOSFETs 65a, 65b).

The source of the second p-channel field effect transistor 64b is connected to the (external) supply voltage, which, as already described above, is at a relatively high voltage level (vddq) in comparison to the internally used voltage.

The drain of the second p-channel field effect transistor 64b is connected to the drain of the second n-channel field effect transistor 65b, as well as to the gate of the first p-channel field effect transistor 64a, and is connected, via a line 69e, to an output 67 of the voltage converter 61.

As further shown in FIG. 6, the source of the second n-channel field effect transistor 65b is connected to ground (gnd), and the gate of the second n-channel field effect transistor 65b via a line 68a to an output of the inverter 63.

The source of the first p-channel field effect transistor 64a is, as opposed to the corresponding transistor 54a in the voltage converter 51 shown in FIG. 5, not directly connected to the (the above relatively high voltage level (vddq)) supply voltage, but with the additional transistor 64c interconnected.

The source of the first p-channel field effect transistors 64a is connected via a line 69a to the drain of the (additional, third) p-channel field effect transistor 64c, of which the source is connected to the supply voltage (at the above relatively high external voltage level (vddq)).

As further shown in FIG. 6, the gate of the third p-channel field effect transistor 64c is connected via a line 69d and a line 68c to an input 66 of the voltage converter 6t.

The input of the inverter 63 is connected, also via the line 68c, to the voltage converter-input 66.

Furthermore, the drain of the first p-channel field effect transistor 64a is connected via a line 69b to the gate of the second p-channel field effect transistor 64b, and to the drain of the first n-channel field effect transistor 65a, and the gate of the first p-channel field effect transistor 64a via a line 69c to the voltage converter output 67 (and to each of the drains of the second n- and of the second p-channel field effect transistors 65b, 64b).

As further shown in FIG. 6, the source of the first n-channel field effect transistor 65a is connected via a line 68b to the output of the inverter 63, and to the gate of the first n-channel field effect transistor 65a (fixed) to the internal voltage (at the above, relatively low, voltage level (vint)).

An internal signal (in) from the DRAM-memory component is present at input 66 of the voltage converter 61 (and thereby also at the gate of the third p-channel field effect transistor 64c, and at the input of the inverter 63).

The (input) signal (in) present at the input of the inverter 63 is inverted by the inverter 63, and the signal (bin) emitted at the output of the inverter 63, inverse to the input signal (in), transferred via the line 68a to the gate of the second n-channel field effect transistor 65b, and via the line 68b to the source of the first n-channel field effect transistor 65a.

The internal signal (in) (always in the corresponding "high logic" state) is, as already described above, at the relatively low, internally used voltage level (vint) in comparison with the externally used voltage level (vddq).

With the aid of the voltage converter 61 the internal signal (in) present at its input 66 can be changed into the signal (out), which corresponds to the signal (in) accessible at the output 67 of the voltage converter 61, and which is at the above, relatively high, external voltage level (vddq).

When the internal signal (in) present at input 66 of the voltage converter 61 changes from a "high logic" to a "low logic" state, as is more closely described below, the corresponding signal (out), accessible at output 67 of the voltage converter 61, similarly changes its state from "high logic" to "low logic".

Due to the change of the internal signal (in) present at input 66 of the voltage converter 61 from "high logic" to "low logic", the signal (bin) emitted at the output of the inverter 63 and for instance relayed to the gate of the transistor 65b, changes its state from "low logic" to "high logic", whereby the (previously blocked) transistor 65b is brought into a conductive state and the (previously conductive) transistor 64b is blocked, although not (yet) completely.

Due to this, the (previously blocked) transistor 64a becomes conductive (whereby current path I, here: the drain source current path of the transistor 64a is switched on).

As FIG. 6 shows, the above, additional, transistor 64c (here: the third p-channel field effect transistor 64) is connected into the current path I that needs to be switched on (here: the current path containing the drain source current path of the transistor 64a).

When, as described above, the internal signal (in) present at the input 66 and fed to the gate of transistor 64c, changes from a "high logic" to a "low logic" state, the additional transistor 64c is brought into a conductive state, i.e. switched on).

The switching on of the transistors 64a, 64c has the effect that the (previously not fully blocked) transistor 64b is completely blocked; a "low logic" output signal (out) is then emitted, as mentioned above, at the output 67 of the voltage converter 61 (during the entire switching-over process transistor 65a remains in a conductive state).

When, in correspondingly inverted fashion as described above, the state of the internal signal (in) changes from "low logic" back to "high logic", the corresponding signal (out) accessible at output 67 similarly changes its state from "low logic" to "high logic".

Due to the change of the internal signal (in) present at the input 66 of the voltage converter 61 from "low logic" to "high logic", the signal (bin) emitted at the output of the inverter 63 and for instance fed to the gate of the transistor 65b, changes its state from "high logic" to "low logic", whereby the (previously conductive) transistor 65b is blocked, and the (previously blocked) transistor 64b becomes, although not (yet) completely, conductive, whereby the (previously conductive) transistor 64a is blocked.

Furthermore, due to the change of the state of the internal signal (in) present at input 66 and fed to the gate of the transistor 64c from a "low logic" to a "high logic" state as well, the additional transistor 64c is brought into a blocked state (i.e. switched off).

The switching off of the transistors 64a, 64c has the effect that the transistor 64b becomes (completely) conductive; a "high logic" output signal (out) is then emitted at the output of the voltage converter 67, as already described above, (whereby the transistor 65a—again, remains in a conductive state during the entire switching-over process).

Due to the above (additional) switching off of the (additional) transistor 64c during the above switching-over process and the controlling of the corresponding transistor 64c with a signal at an input instead of an output voltage level (i.e. with the above internal signal (in)), the current path 1 to be switched off is already placed in a corresponding high-impedance state at the start of the switching process.

Hereby the switching speed can be increased, i.e. the delay time at the switching over of the output signal (out) can be reduced.

Furthermore, cross-currents flowing during switching-over can be reduced, whereby higher voltage level differentials can be achieved between the output signal (out), and the input signal than with corresponding conventional circuits.

In further, alternative embodiment examples not explicitly described here, transistors corresponding to the additional transistor 64c can be inserted at other corresponding positions in the current path I, that is to be switched from "low logic" to "high logic" when the out-put signal (out) switches over than in the embodiment example shown in FIG. 6.

For example, the transistor corresponding to transistor 64c (and correspondingly controlled for instance via the line 69d), instead of being connected between the source of the first p-channel field effect transistor 64a, and the above (internal) supply voltage (at the above voltage level vddq) can for instance also for also be connected between the drain of the first p-channel field effect transistor 64a and the line 69b) (so that the drain of the corresponding transistor is connected to the drain of the first n-channel field effect transistor 65a, and to the gate of the second p-channel field effect transistor 64b, and the source of the corresponding transistor to the drain of the first p-channel field effect transistor 64a).

As an alternative (to the alternative embodiment example just described, or to the one shown in FIG. 6) the inverse signal (bin'$_{int}$)—separately generated by the inverter 63 for the voltage converter 61—present at the semi-conductor component and also used for one or more functions—can also be used to control a corresponding transistor instead of the above inverse input signal (bin).

The signal bin'$_{int}$ can for instance be directly fed to the gate of the third p-channel field effect transistor 64b via a line 69d' (shown in FIG. 6 as a broken line and provided as an alternative to the line 69d).

The inverter 63 can then be dispensed with (so that one of the lines 68b, 68a, i.e. the gate of the second n-channel field effect transistor 65, and the source of the first n-channel field effect transistor 65a are directly connected, for instance via a line 68c' shown as a broken line in FIG. 6—to the input 66 of the voltage converter 61 (and thereby to the signal (in) present there)).

Figure 7:
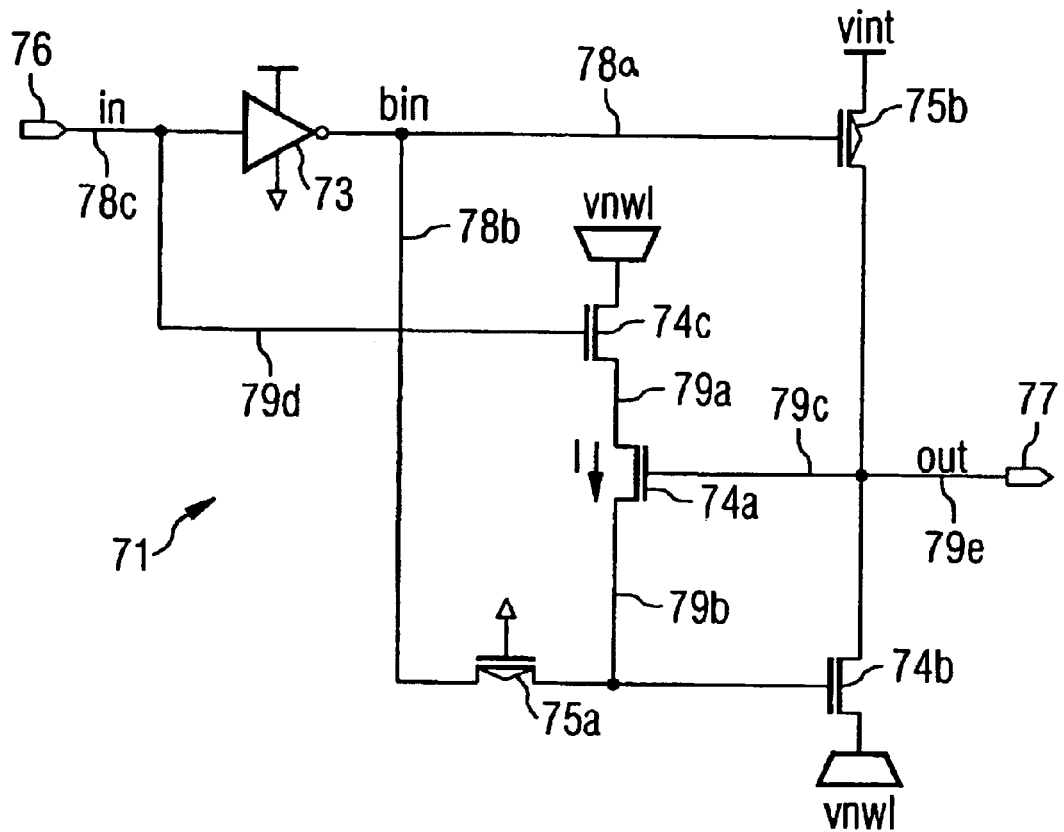
FIG. 7 is a schematic representation of a circuit configuration of a voltage converter according to a further alternative embodiment example of the present invention.

FIG. 7 is a schematic representation of a circuit configuration of a further, alternative embodiment example of a voltage converter and/or level shifter 71 according to the present invention.

The voltage converter and/or a voltage level shifter 71 is, corresponding to the voltage converters 51, 61 shown in FIGS. 5 and 6, built into a DRAM memory component, for instance, one based on CMOS technology. It serves, as more closely described below, to convert the internal voltage level in used inside the memory component, into a corresponding external voltage level used outside the memory component.

As shown in FIG. 7, the voltage converter 71 has four transistors 74a, 74b, 75a, 75b, in fact a first and a second n-channel field effect transistor 74a, 74b (here: two n-channel MOSFETs 74a, 74b), as well as a first and a second p-channel field effect transistor 75a, 75b (here: two p-channel MOSFETs 75a, 75b), as well as, opposed to corresponding conventional circuits, and as more closely described below, an additional transistor 74c (in fact a third n-channel field effect transistor 74c (here: an n-channel MOSFET 74c)), and an additional inverter 73.

The source of the second n-channel field effect transistor 74b is connected to an internal voltage (at a—negative—voltage level (vnwl), for instance lying between –0.2 V and –0.6 V, in particular –0.4 V).

The drain of the second n-channel field effect transistor 74b is connected to the drain of the second p-channel field effect transistor 75b, as well as to the gate of the first n-channel field effect transistor 74a, and is connected, via a line 79e, to an output 77 of the voltage converter 71.

As further shown in FIG. 7, the source of the second p-channel field effect transistor 75b is connected to a positive internal voltage at a positive voltage level (vint), which can lie between +1.5 V and +2.0 V (here for instance +1.5 V or +1.8 V).

The gate of the second p-channel field effect transistor 75b is furthermore connected via a line 78a to an output of the inverter 73.

The source of the first n-channel field effect transistor 74a has, as opposed to corresponding conventional voltage converters, not been directly connected to the—negative—internal voltage (at the above voltage level (vnwl)), but rather interconnected to the—additional—transistor 74c.

The source of the first n-channel field effect transistor 74a is connected via a line 79a to the drain of the (additional, third) n-channel field effect transistor 74c, of which the source is connected to the—negative—internal voltage (at the above voltage level (vnwl)).

As further shown in FIG. 7, the gate of the third n-channel field effect transistor 74c is connected via a line 79d, and a line 78c to an input 76 of the voltage converter 71.

The input of the inverter 73 is, also via the line 78c, connected to the voltage converter input 76.

Furthermore, the drain of the first n-channel field effect transistor 74a is connected via a line 79b to the gate of the second n-channel field effect transistor 74b, and to the drain of the first p-channel field effect transistor 75a, and to the gate of the first n-channel field effect transistor 74a via a line 79c to the voltage converter-output 77 (and in each case to the drain of the second p- and the second n-channel field effect transistor 75b, 74b).

As further shown in FIG. 7, the source of the first p-channel field effect transistor 75a is connected via a line 78b to the output of the inverter 73, and the gate of the first p-channel field effect transistor 75a (fixed) to ground.

An internal signal (in) of the DRAM-memory component is present at the input 76 of the voltage converter 71 (and thereby also at the gate of the third n-channel field effect transistor 74c, and at the input of the inverter 73).

The (input )signal (in) present at the input of the inverter 73 is inverted by the inverter 73, and the signal (bin)—inverse to the input signal (in) emitted at the output of the inverter 73—is fed via a line 78a to the gate of the second p-channel field effect transistor 75b, and via the line 78b to the source of the first p-channel field effect transistor 75a.

The internal signals (in) and/or (bin) are—in the correspondingly "high logic" state—at the above (positive) internal voltage level (vint) (here for instance +1.5 V or +1.8 V), and—in the corresponding "low logic" state—at a correspondingly low voltage level (for instance 0 V (ground voltage)).

With the aid of the voltage converter 71 the internal signal (in) at its input 76 can be converted into a signal (corresponding to this signal (in) and accessible at output 77 of the voltage converter 71), which—in the corresponding "high logic" state—is at the above (positive) internal voltage level (vint)(here for instance +1.5 V or +1.8 V), and—in the corresponding "low logic" state—at the above (negative) internal voltage level (vnwl) for instance lying between −0.2 V and −0.6 V, in particular at −0.4 V.

When the internal signal (in) present at the input 76 of the voltage converter 71 changes from a "high logic" to a "low logic" state, the signal (out) accessible at the output 77 of the voltage converter 71—as more closely described below—the corresponding, similarly changes its state from "high logic" to "low logic".

Due to the change of the internal signal (in) present at input 76 of the voltage converter 71 from "high logic" to "low logic", the signal (bin) emitted at the output of the inverter 73, and fed for instance to the gate of the transistor 75b, changes its state from "low logic" to "high logic", whereby the (previously conductive) transistor 75b is brought into a blocked state, and the (previously blocked) transistor 74b made, although not (yet) completely, conductive.

Thereby, the (previously conductive) transistor 74a is blocked (whereby the current path I, here: the drain-source current path of the transistor 74a, is switched off).

As is clear from FIG. 7, the above, additional, transistor 74c (here: the third n-channel field effect transistor 74c) is connected in the current path I to be switched off (here: the current path containing the drain source current path of the transistor 74a).

When, as described above, the internal signal (in) present at input 76 and fed to the gate of the transistor 74c, changes from a "high logic" to a "low logic" state, the—additional—transistor 74c is brought into a blocked state (i.e. switched off).

By blocking the transistors 74a, 74c the (previously not yet completely conductive) transistor 74b becomes completely conductive; at the output 77 of the voltage converter 71, as mentioned above, a "low logic" output signal (out) is emitted (during the entire switching-over process the transistor 75a remains in a conductive state).

Due to the (additional) switching off of the (additional) transistor 74c during the above switching-over process, and the control of the corresponding transistor 74c by a signal at input instead of at output level (i.e. by the above internal signal (in)) the current path I to be switched off has already been brought into a high-impedance state at the start of the switching-over process.

Hereby the switching speed can be increased, i.e. the delay time at the switching over of the output signal (out) can be reduced.

Furthermore the cross-currents flowing during switching-over are reduced, whereby higher voltage level differentials between the output signal (out), and the input signal (in) can be achieved than with corresponding, conventional switching circuits.

When, in the correspondingly inverse fashion described above, the state of the internal signal (in) changes from "low logic" back to "high logic" again, the corresponding signal (out)(accessible at output 77) also changes its state from "low logic" to "high logic".

Due to the change of the internal signal (in) present at input 76 of the voltage converter 71 from "low logic" to "high logic", the signal (bin) emitted at the output of the inverter 73, and for instance fed to the gate of the transistor 75b, changes its state from "high logic" to "low logic", whereby the (previously blocked) transistor 75b becomes conductive, and the transistor 74b, although not (yet) completely, blocked, whereby the (previously blocked) transistor 74a becomes conductive.

Furthermore the change in the state of the internal signal (in), present at input 76 and fed to the gate of the transistor

74c, from "low logic" to "high logic" also brings the additional transistor 74c in a conductive state (i.e. switched on).

The switching on of the transistors 74a, 74c has the effect that the, initially not yet fully blocked, transistor 74b becomes fully blocked; at the output of the voltage converter 77, as already described above, a "high logic" output signal (out) is then emitted (whereby the transistor 75a—again, remains in a conductive state during the entire switching-over process).

In further alternative embodiment, examples not explicitly shown here—corresponding to the embodiment example described above—transistors corresponding to the additional transistor 74c can also be connected in correspondingly different places in the current path I—that is to be switched off at the switching over of the output signals (out) from "high logic" to "low logic"—than that shown in the embodiment example shown in FIG. 7 (for instance transistors corresponding to the transistor 74c (and accordingly controlled for instance via the line 79d), instead of being connected between the source of the first field effect transistor 74a, and the above (negative, internal) voltage (in contrast to the above voltage level vnwl) can also for instance be connected between the drain of the field effect transistor 74a, and the line 79b.

What is claimed is:

1. A voltage level converter device for the conversion of an input signal, which is at a first voltage level, into an output signal, which is at a second voltage level that differs from the first voltage level, the voltage level converter device comprising:

a first and a second output transistor connected in series, whereby the output signal is output at an output of the voltage level converter device provided between the first and the second output transistors;

a third transistor having a control gate which is connected to the output of the voltage level converter device, and a source-drain current path which is connected to a control gate of the first output transistor;

a fourth transistor having a source-drain path which is directly connected between corresponding control gates of the first and the second output transistors, and which is further connected between the first transistor and an input of the voltage level converter device, whereby an additional transistor is connected to the source-drain current path of the third transistor to be switched on or off when switching over the output signal, and the additional transistor, which is under control of a control signal comprising a voltage level corresponding to the voltage level of the input signal, is switched on or off for switching on or off the current path.

2. The voltage level converter device of claim 1, wherein an inverter is connected between the source-drain path of the fourth transistor, and the input of the voltage level converter device.

3. The voltage level converter device of claim 1, wherein the voltage level converter device is incorporated in a semi-conductor component.

4. The voltage level converter device of claim 2, wherein the signal used as a control signal for the additional transistor is a signal present at the semi-conductor component, and is additionally used to control further functions on the semiconductor component.

* * * * *